United States Patent [19]

Prokopp

[11] Patent Number: 4,897,712
[45] Date of Patent: Jan. 30, 1990

[54] HEAT SINK, PARTICULARY FOR THE COOLING OF ELECTRONIC ELEMENTS

[75] Inventor: Alexander Prokopp, Freiberg/Neckar, Fed. Rep. of Germany

[73] Assignee: Süddeutsche Kühlerfabrik Julius Fr. Behr GmbH & Co. KG, Stuttgart, Fed. Rep. of Germany

[21] Appl. No.: 153,049

[22] Filed: Feb. 8, 1988

[30] Foreign Application Priority Data

Feb. 7, 1987 [DE] Fed. Rep. of Germany ....... 3703873

[51] Int. Cl.$^4$ ................. H01L 23/34; H01L 23/36; H01L 23/40
[52] U.S. Cl. .................................................. 357/81
[58] Field of Search ............... 357/81, 82; 165/80.2, 165/80.3, 185

[56] References Cited

U.S. PATENT DOCUMENTS

| 4,340,902 | 7/1982 | Honda et al. | 357/81 |
| 4,356,864 | 11/1982 | Ariga et al. | 165/80.3 |
| 4,765,400 | 8/1988 | Chu et al. | 165/185 |

FOREIGN PATENT DOCUMENTS 2502472 1/1975 Fed. Rep. of Germany ........ 357/81

Primary Examiner—Rolf Hille
Assistant Examiner—S. V. Clark
Attorney, Agent, or Firm—Barnes & Thornburg

[57] ABSTRACT

A heat sink, particularly for the cooling of electronic structural elements, has a base body, on which the structural elements and a cooling element that carries off the heat are arranged next to one another. An enlargement of the heat transmission surfaces relative to the overall size of the cooling element, and a resulting higher cooling performance are achieved by means of the fact that the cooling element is developed as a bundle of ribs consisting of a plurality of sheets. The sheets are arranged essentially in parallel and at a distance to one another that is determined by the plate thickness and density of the bundle of ribs. The sheets are connected with one another at one of their longitudinal sides and the bundle of ribs forming the cooling element are connected with the base body in a material locking way via a solder connection or the like. This development of the heat sink permits an individualized design of the cooling element for the optimal removal of the heat generated by the components.

11 Claims, 3 Drawing Sheets

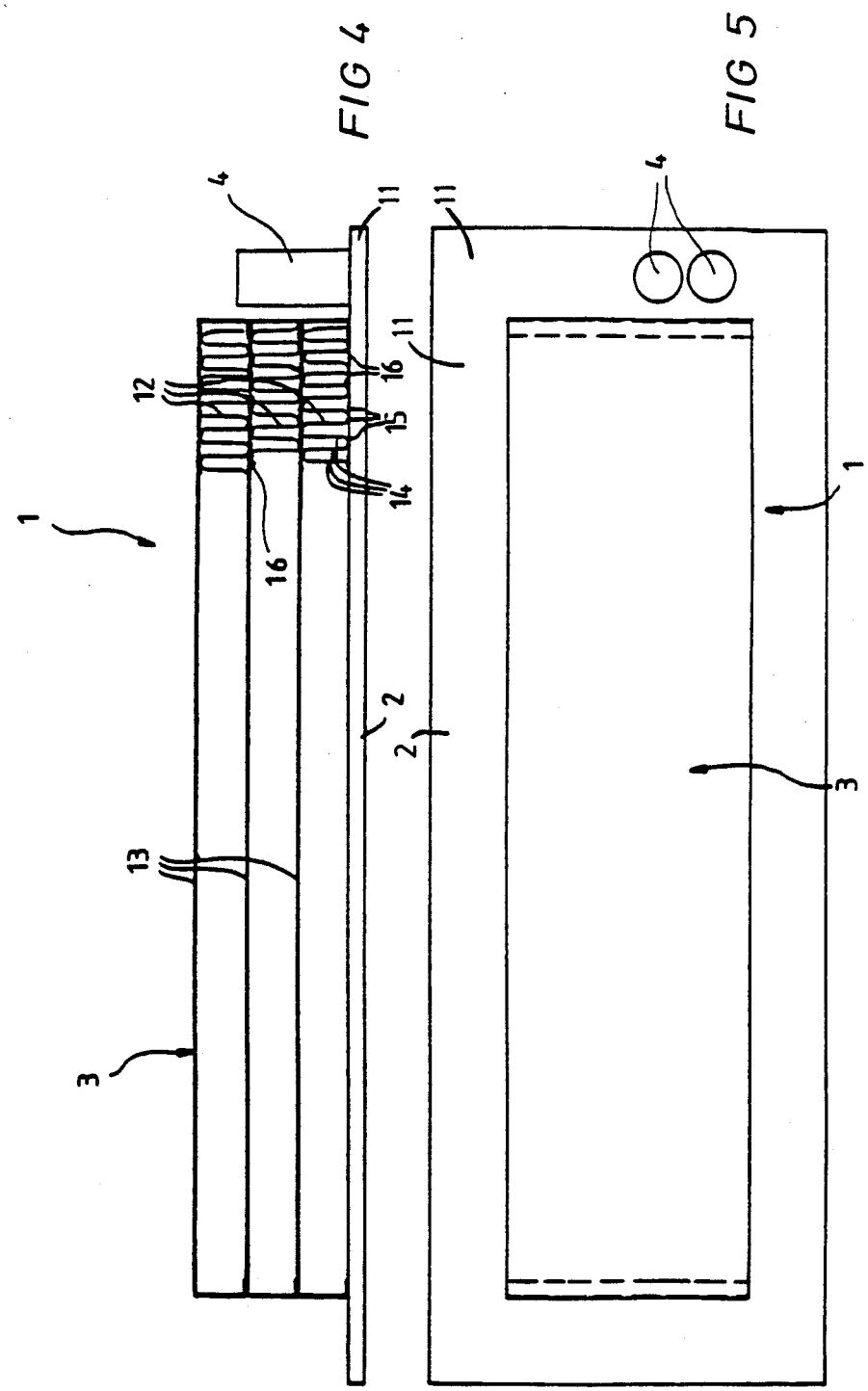

HEAT SINK, PARTICULARY FOR THE COOLING OF ELECTRONIC ELEMENTS

BACKGROUND AND SUMMARY OF THE INVENTION

The invention relates to a heat sink, particularly for the cooling of electronic structural elements, having a base body on which the structural elements and a cooling element that carries off heat are arranged next to one another.

Heat sinks of this type are known and, as a rule, consist of aluminum extruded sections. In this case, a base plate that is developed as a base body has cooling projections developed as ribs that are connected in one piece with the base body and represent the cooling element. This heat sink is manufactured in the extrusion process and is therefore limited with respect to design possibilities and different receiving possibilities for the structural elements. As a result of the manufacturing process, thin high ribs with a simultaneously narrow rib distance are not possible. This has the result that heat sinks of this type, relative to their overall size, have relatively small heat transmission surfaces.

Another known heat sink, described in German Published Unexamined Patent Application No. (DE-OS) 35 00 976, provides that on a base plate, several cooling projections are provided that have a fastening flange. These cooling projections may, for example, consist of thin sheet-metal strips that, next to one another, at the distance of their fastening flange, are connected with the base plate via a welded connection. As a result of the fastening flanges that must have a suitable width, because of the welded connection, the cooling projections cannot be packed arbitrarily densely. This heat sink also has the disadvantage that the cooling projections must be fastened at the base plate successively which is time-consuming and cost-intensive.

An objective of the invention is to provide a heat sink that can be adapted individually to the special cooling problems occurring in electrical equipment, that, relative to its overall size, has a relatively large heat transfer surface and can be manufactured in an uncomplicated way.

According to the invention, this objective is achieved by the fact that the cooling element is developed as a bundle of ribs consisting of a plurality of sheets, the sheets being arranged essentially in parallel and a distance to one another that is determined by the thickness of the plates of the bundle of ribs. These sheets are connected with one another at one of their longitudinal sides and the bundle of ribs is connected with the base body in a material connecting or locking manner such as by soldering.

The heat sink according to the invention has a base body on which the structural elements to be cooled are arranged, for example, in an edge area. Adjacently, the cooling element is arranged that is connected with the base body in a material connecting manner such as by soldering. This cooling element consists of sheet metal plates, the individual plates having a distance to one another. The sheets may be held, for example, via a soldered bridge or the like so that they are located at a specified distance from one another and are also connected with one another in a material connectinq manner and form a bundle of ribs, namely the cooling element. This bundle of ribs, in turn, is connected with the base body in a material connecting manner. By means of the suitable selection of the spacing of the individual sheet metal plates, of the thickness of the plates and of the dimensioning of the plate surfaces, the cooling element may be developed in such a way that on the one hand, it has the required base surface so that sufficient space still exists for the fastening of the structural elements and, on the other hand, it possesses the required heat transfer surface in order to reliably carry off the heat that is generated by the structural elements. By means of the variation of the number of sheets as well as their size, their spacing and their thickness, whereby the sheet density of the bundle of ribs is determined, an optimal design of the cooling element is easily possible.

The material connection of the cooling element with the base body, in addition to the merits of other undetachable connections, has the advantage that the whole heat sink possesses the heat transfer characteristics of a one-piece body. No hollow spaces or heat-insulating inserts exist between the base body and the cooling element that could impair the flow of heat.

An easy varying of the distance between the individual sheets is achieved by providing between the sheets intermediate sheets that determine the gap width. The thickness of the intermediate sheets determine the distance between the individual sheets that carry the heat away from the base body.

Preferably, the intermediate sheets are arranged at a longitudinal side of the sheets and are connected with them in a material connecting manner. The sheets, by means of the inserting of the intermediate sheets, can be built into the finished cooling element that subsequently must only still be connected with the base body.

Advantageously, the material connection of preferred embodiments is a soldered connection, preferably a flux-free soldered connection. By means of the arrangement of the intermediate sheets at a longitudinal side of the sheets and by means of the material connection with these, the cooling element that is developed as a bundle of ribs offers a suitable contact surface, via which it can be connected with the base body. The flux-free soldered connection offers the advantage that, as a result of the wetting characteristic of the solders and of the suction effect of the capillary gaps, it offers a large-surface connection of the surfaces that rest against one another. By means of a soldered connection, cooling elements with large dimensions can also be fixed on the base body without hollow spaces and without inserts or inclusions. The material connection of the individual components among one another ensures an optimal heat transmission and heat flow between the base body and the cooling element. The heat is transmitted to an air flow that is directed in parallel to the sheets and flows through the cooling element.

Preferred embodiments provide that the cooling element is constructed of L-shaped, T-shaped or U-shaped sheets that, in the area of their projections or crossbars, for receiving additional structural elements, forming a contact surface, are connected with one another in a material-locking way via intermediate sheets. In this case, the intermediate sheets that are arranged between the L-shaped and T-shaped sheets and hold them at a distance from one another, are advantageously provided in the area of the projections of the sheets, so that a massive crossbar is created. The thus formed crossbar that projects from the cooling element may serve as an additional contact surface for structural elements. In the case of a T-shaped development of the sheets, two crossbars for the additional receiving of structural elements are obtained that are arranged on opposite sides of the cooling element. In the case of U-shaped sheets, a massive crossbar for receiving the structural elements is obtained that connects the free legs of the sheets.

In the case of special installation conditions, it is advantageous for the sheets to be arranged diagonally with respect to the edges of the base body. As a result of the diagonal position of the sheets, in which case these continue to be disposed in parallel to one another, the heat sink may be adapted, for example, to a specified air guidance in an electronic device unit so that a high heat transmission continues to be achieved.

Further preferred embodiments provide that the cooling element is part of a bundle of ribs that consists of a plurality of L-shaped, T-shaped or cross-shaped sheets, in which case the sheets are connected with one another in a material-locking way essentially in parallel to one another and, in their area having the projections, via intermediate sheets. The projections that are connected with one another via the intermediate sheets form the base body that receives the structural elements and the remaining bundle of ribs forms the cooling element. The base body is now formed by the projections that are connected with one another via the intermediate sheets. By adding additional intermediate sheets to the two extreme sheets, a surrounding edge can be formed that receives the structural elements. In the case of the cross-shaped sheets, the cooling element extends at both sides of the base body.

Another embodiment provides that the sheets are developed as at least one corrugated rib strip. This corrugated rib strip has the advantage that it can be connected immediately with the base body because the individual parallel sheet sections are already spaced away from one another. This corrugated rib strip is fixed on the base body in such a way that it rests against the base body with its corrugation arches, so that the air flow can pass through unhindered between the individual sheet sections. The corrugated rib strip and the base body are connected with one another in a material-locking way. An increase of the heat flow is caused by filling out the wedge-shaped gaps between the corrugation arches and the base body with solder.

In order to increase the heat transmission, two or more corrugated rib strips are provided. In this case, it is advantageous for one corrugated rib strip to have a cover sheet at the side that faces away from the base body, another corrugated rib strip being arranged on this cover sheet. A further increase of the heat transmission is achieved by the mounting of additional corrugated rib strips that are arranged above one another in such a way that between them, only one cover sheet is provided that is used for the conduction of heat within the cooling element and carries the fitted-on corrugated rib strip.

Advantageously, the base body and/or the cover sheets are coated with a soldering material or carry a soldering foil for accommodating the material locking connection.

A compact heat sink is obtained by the fact that the base body projects over the cooling element on all sides. The structural elements may be provided on the side that carries the cooling element as well as on the opposite side. In addition, the base body may be equipped either with a cooling element that is arranged on one side, or both sides may carry cooling elements. If necessary, the cooling element may also frame the component or components.

Other objects, advantages and novel features of the present invention will become apparent from the following detailed description of the invention when considered in conjunction with the accompanying drawings.

BRIEF DESCRIPTION OF THE DRAWINGS

FIG. 4 is a lateral view of a heat sink with several corrugated rib strips, constructed in accordance with a fourth preferred embodiment of the invention; and FIG. 5 is a top view of the heat sink according to FIG. 4.

DETAILED DESCRIPTION OF THE DRAWINGS

Figure 1:
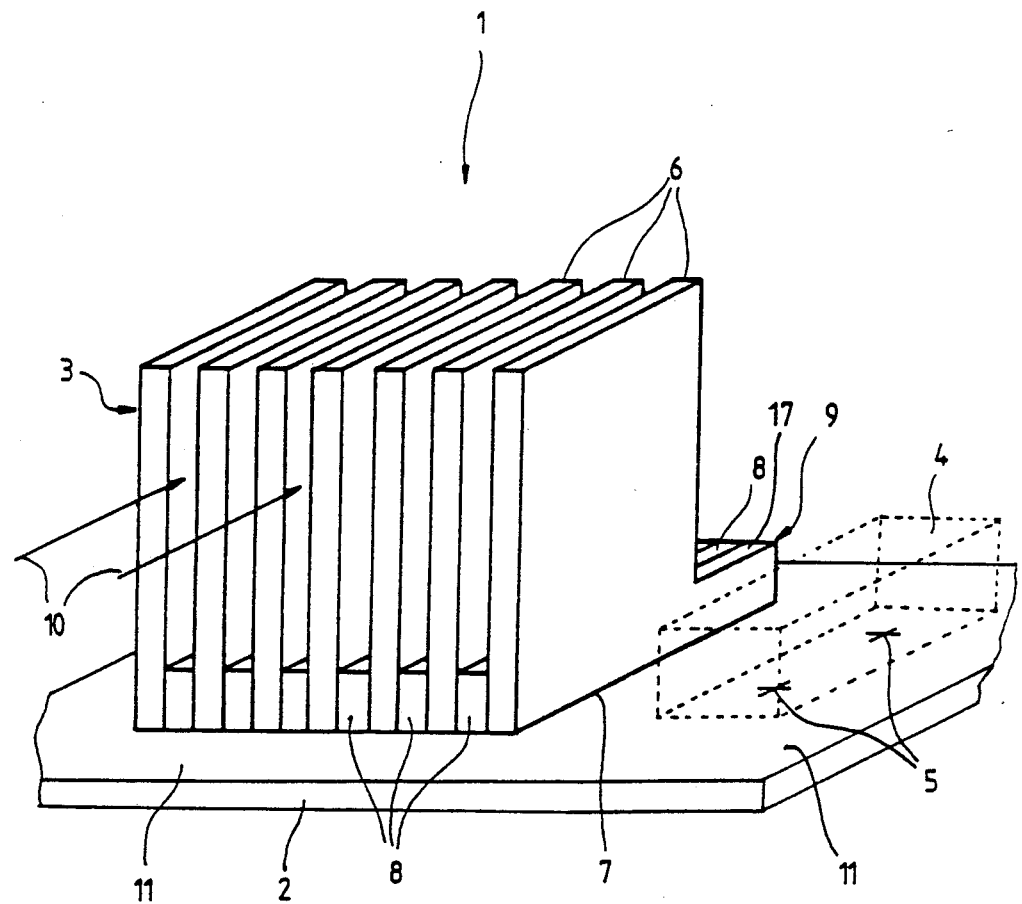
FIG. 1 is a perspective view of a heat sink developed in the shape of an L and constructed in accordance with a preferred embodiment of the invention.

FIG. 1 shows a heat sink 1, consisting of a base body 2 and of a cooling element 3 that is arranged on it. Next to the cooling element 3, an electronic structural element 4, shown in dashed lines, is arranged on the base body 2, the connecting lines of this structural element 4 being led through bores 5. The cooling element 3 comprises L-shaped sheets 6 that are arranged in parallel and at a distance to one another. In the area of the front face 7 that faces the base body 2, intermediate sheets 8 are arranged between the sheets 6, these intermediate sheets (8) having a length that corresponds to the length of the front face 7. In this embodiment, their height corresponds to the height of the crossbar 9 that is formed by the L-shaped sheets 6. However, the intermediate sheets 8 may also be developed in such a way that, only in the area of the crossbar 9, they have its height, but otherwise have a smaller or a larger height. Advantageously, on the surface formed by the crossbar 9, additional structural elements may be arranged that are now connected directly with the cooling element 3. If, for thermic reason, the crossbar 9 is not necessary, the projections 17 are also not required.

The air that flows in the direction of the Arrows 10 passes through the sheets 6 while absorbing heat. This heat is transmitted to the base body 2 by the structural elements 4 to be cooled and from this base body 2, flows into the sheets 6 of the cooling element 3. A good heat transmission during the transfer from the base body 2 into the cooling element 3 is achieved by the fact that the cooling element 3 is connected with the base body in a material-locking manner. For this purpose, the surfaces to be connected with one another are coated with a soldering material or have a soldering foil. Also, the surfaces of the sheet 6 and of the intermediate sheets 8 that rest against one another are connected with one another by a soldering. As a result, heat conduction characteristics are obtained as in the case of a heat sink 1 that is developed in one piece.

The cooling element 3 may be shaped in such a way that it sits on the base body 2 so that its surface and the surfaces of the electronic structural elements 4 cover one another. In this case, the cooling element 3 is advantageously surrounded by an edge 11 of the base body 2, on which the structural elements 4 are arranged which then also later in the installed condition, will still be easily accessible. It may also be provided that the structural element 4 is framed by the cooling element 3 so that the heat to be removed can flow off to all sides.

Figure 2:
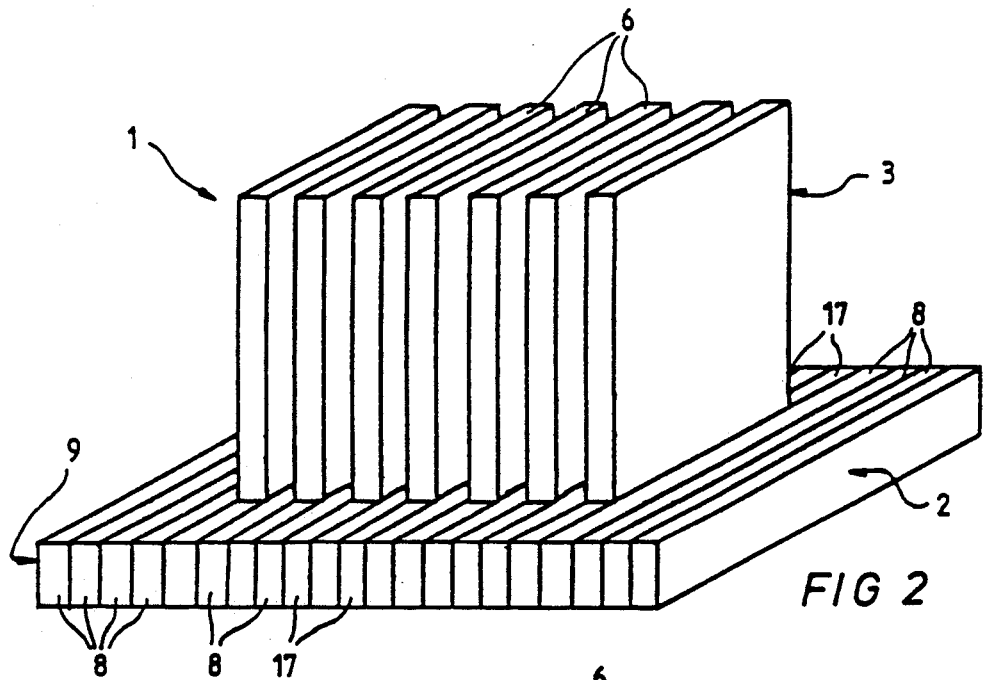
FIG. 2 is a perspective view of a heat sink with T-shaped sheets and a surrounding edge that is formed by the intermediate sheets and the projections of the sheets, constructed in accordance with a second preferred embodiment of the invention.

FIG. 2 shows a heat sink 1, whose cooling element 3 comprises T-shaped sheets 6 that are spaced away from one another via intermediate sheets 8. These intermediate sheets 8 are arranged in such a way and advantageously have a size that they form a massive crossbar 9 with the projections 17 of the T-shaped sheets 6 that are located between the intermediate sheets 8. This crossbar 9 is used as a surrounding edge for receiving the structural elements (not shown). The base body 2 is now formed by the intermediate sheets 8 and the projections 17 of the sheets 6.

Another, not shown embodiment provides that the sheets 6 have a U-shape and that in each case the intermediate sheets 8 are arranged between the crossbar connecting the two legs of the U. The base body 2, in this case, consists of the intermediate sheets 8 and the crossbars of the U-shaped sheets 6.

Figure 3:
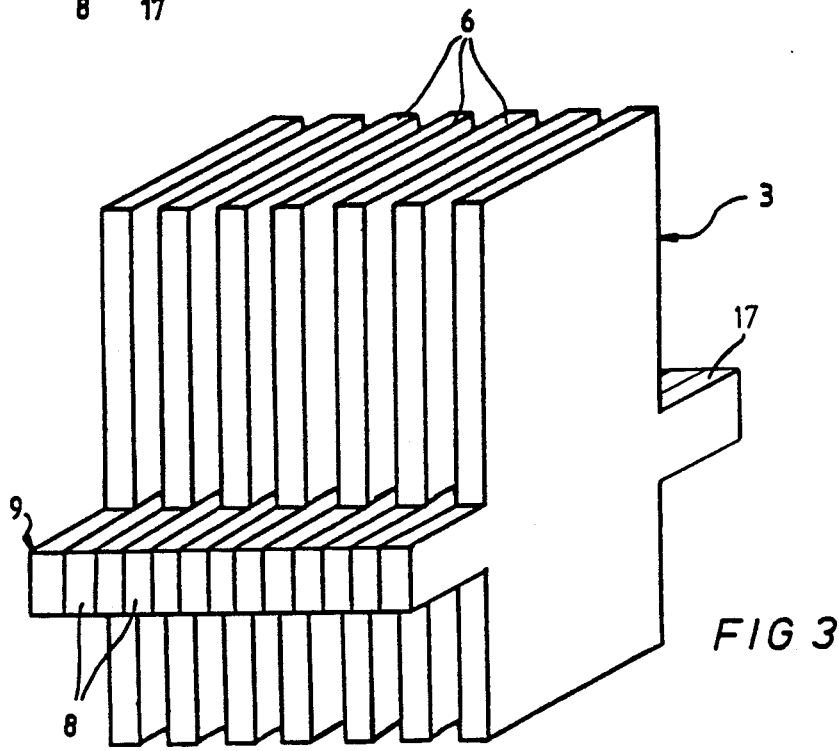
FIG. 3 is a perspective view of a heat sink with cross-shaped sheets, constructed in accordance with a third preferred embodiment of the invention.

FIG. 3 shows an embodiment in which the sheets 6 are developed in a cross-shape. As a result, a crossbar 9 is formed on both sides of the bundle of sheets. The heat sink 3 extends above and below the plane of the crossbars.

In the case of the heat sink 1 shown in FIG. 4, corrugated rib strips 12 are arranged on a base body 2, these corrugated rib strips 12 forming the cooling element 3. The corrugated rib strips 12 consist of a plurality of essentially parallel sheet sections 14 which, in each case, in pairs are connected via a corrugation arch 15. The arrangement of the corrugated rib strips 12 on the surface of the base body 2 takes place in such a way that the corrugated arches 15 of one side of the strips 12 rest on the base body 2 and are connected with it in a material-locking way, for example, by means of soldering. In order to increase the conduction of heat, the wedge-shaped gaps 16, on both sides of the corrugation arch 15 and the base body 2, are filled out with solder.

On the first corrugated rib strip 12, a cover sheet 13 is provided that is used for the simple material-locking fastening of another corrugated rib strip 12. Corresponding to the amount of heat to be removed, the cooling element 3 may consist of one or several corrugated rib strips 12 that are advantageously arranged above one another. A material-locking connection is achieved by the fact that the cover sheets 13 are coated with a soldering material or carry a soldering foil. The soldering takes place, for example, flux-free, in a soldering chamber. The connection between the corrugated rib strip 12 and the base plate 2 also takes place by means of solder coating or by means of a soldering foil. On the edge 11 surrounding the cooling element 3, the structural elements 4 are arranged that are to be cooled and that, also in the case of this embodiment, are easily accessible in the installed condition.

Although the present invention has been described and illustrated in detail, it is to be clearly understood that the same is by way of illustration and example only, and is not to be taken by way of limitation. The spirit and scope of the present invention are to be limited only by the terms of the appended claims.

I claim:

1. A heat sink arrangement for cooling electronic structural component means and the like, comprising:
   cooling element means,
   and a base body for supporting the cooling element means and electronic structural component means to be cooled, wherein the cooling element means includes a plurality of sheet metal plate cooling sheets arranged essentially in parallel to one another and intermediate sheets interposed between the cooling sheets for determining the spacing between the cooling sheets, said cooling sheets and intermediate sheets being connected to one another and to said base body by solder connections, said cooling sheets extending transversely of said base body by a substantially greater distance than do the intermediate sheets such that gaps extend between the cooling sheets for accommodating cooling fluid flow therethrough.

2. A heat sink arrangement according to claim 1, wherein the intermediate sheets extend along a longitudinal side of the respective cooling sheets connected thereto.

3. A heat sink arrangement according to claim 1, wherein said cooling sheets are constructed as L-shaped sheets which each have a base leg surface extending in the same plane as a surface of adjacent ones of said intermediate sheets to thereby form a planar receiving area for electronic structural component means on top of the respective adjacent intermediate sheets and base leg surfaces of the cooling sheets.

4. A heat sink arrangement according to claim 1, wherein said cooling sheets are constructed as inverted T-shaped sheets which each have surfaces of respective T-legs extending in the same plane as adjacent ones of said intermediate sheets to thereby form a planar receiving area for electronic structural component means on top of the respective adjacent intermediate sheets and T-legs of the cooling sheets.

5. A heat sink arrangement according to claim 1, wherein said cooling sheets are constructed as U-shaped sheets which each have a transverse connecting surface extending in the same plane as surfaces of adjacent ones of said intermediate sheets to thereby form a planar receiving area for electronic structural components means on top of the respective adjacent intermediate sheets and transverse connecting surfaces of the cooling sheets.

6. A heat sink arrangement according to claim 1, wherein the cooling and intermediate sheets are arranged diagonally to the edges of the base body.

7. A heat sink arrangement according to claim 1, wherein the cooling sheets are developed as at least one corrugated rib strip;

8. A heat sink arrangement according to claim 7, wherein the corrugated rib strip includes corrugation arches and is fastened at the base body with its corrugation arches.

9. A heat sink arrangement according to claim 8, wherein the base body is provided with several corrugated rib strips which, at their side facing away from the base body, have cover sheets on which an additional corrugated rib strip is arranged in each case.

10. A heat sink arrangement according to claim 8, wherein wedge shaped gaps between corrugation arches of the rib strips and the base body are filled out with sodder.

11. A heat sink arrangement according to claim 1, wherein the base body projects beyond the cooling sheets on all sides.

* * * * *